(12) United States Patent
Ohnishi et al.

(10) Patent No.: US 10,137,536 B2
(45) Date of Patent: Nov. 27, 2018

(54) SN-CU-BASED LEAD-FREE SOLDER ALLOY

(71) Applicant: SENJU METAL INDUSTRY CO., LTD., Tokyo (JP)

(72) Inventors: Tsukasa Ohnishi, Tokyo (JP); Shunsaku Yoshikawa, Tokyo (JP); Seiko Ishibashi, Tokyo (JP); Rei Fujimaki, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 201 days.

(21) Appl. No.: 14/369,541

(22) PCT Filed: Dec. 25, 2012

(86) PCT No.: PCT/JP2012/083438
§ 371 (c)(1),
(2) Date: Jun. 27, 2014

(87) PCT Pub. No.: WO2013/099849
PCT Pub. Date: Jul. 4, 2013

(65) Prior Publication Data
US 2015/0029670 A1    Jan. 29, 2015

(30) Foreign Application Priority Data
Dec. 27, 2011    (JP) .................. 2011-286132

(51) Int. Cl.
*B23K 35/26*    (2006.01)
*C22C 13/00*    (2006.01)
(Continued)

(52) U.S. Cl.
CPC ........ *B23K 35/262* (2013.01); *B23K 35/0233* (2013.01); *B23K 35/0244* (2013.01);
(Continued)

(58) Field of Classification Search
CPC ............................. B23K 35/262; C22C 13/00
(Continued)

(56) References Cited

U.S. PATENT DOCUMENTS 6,319,461 B1    11/2001    Domi et al.
2002/0141155 A1    10/2002    Pinneo
(Continued)

FOREIGN PATENT DOCUMENTS

CN    1304344    7/2001
CN    1832157    9/2006
(Continued)

OTHER PUBLICATIONS

International Search Report, PCT/JP2012/083438, dated Mar. 5, 2013.
(Continued)

*Primary Examiner* — Weiping Zhu
(74) *Attorney, Agent, or Firm* — Young & Thompson

(57) ABSTRACT

Provided is a solder alloy having excellent wettability on both of a Cu surface and an Ni surface. The solder alloy has such an alloy composition that 0.6 to 0.9 mass % of Cu and 0.01 to 0.1 mass % of Al are contained, 0.02 to 0.1 mass % of Ti and/or 0.01 to 0.05 mass % of Co may be contained as required and the remainder is made up by Sn.

7 Claims, 3 Drawing Sheets

(51) Int. Cl.
*H05K 3/34* (2006.01)
*H01L 23/373* (2006.01)
*H01L 23/42* (2006.01)
*B23K 35/02* (2006.01)
*H01L 27/00* (2006.01)
*H05K 1/02* (2006.01)
*H01L 23/552* (2006.01)

(52) U.S. Cl.
CPC ......... *C22C 13/00* (2013.01); *H01L 23/3736* (2013.01); *H01L 23/42* (2013.01); *H01L 27/00* (2013.01); *H05K 1/0203* (2013.01); *H05K 3/3463* (2013.01); *H01L 23/552* (2013.01); *H01L 2924/0002* (2013.01); *H05K 3/341* (2013.01); *H05K 2201/10371* (2013.01)

(58) Field of Classification Search
USPC .......................................................... 148/24
See application file for complete search history.

(56) References Cited

U.S. PATENT DOCUMENTS

| | | |
|---|---|---|
| 2003/0007885 A1 | 1/2003 | Domi et al. |
| 2006/0202324 A1 | 9/2006 | Hashimoto et al. |
| 2009/0065097 A1 | 3/2009 | Chen |
| 2012/0199393 A1 | 8/2012 | Yoshikawa et al. |

FOREIGN PATENT DOCUMENTS

| | | | | |
|---|---|---|---|---|
| CN | 101264557 | | 9/2008 | |
| CN | 101988165 | | 3/2011 | |
| EP | 1106301 | | 6/2001 | |
| EP | 1106301 A1 | * | 6/2001 | ........... B23K 35/262 |
| JP | 60-166192 | | 8/1985 | |
| JP | 2001-058287 | | 3/2001 | |
| JP | 2001-129682 | | 5/2001 | |
| JP | 2001-269772 | | 10/2001 | |
| JP | 2005-019427 | | 1/2005 | |
| JP | 2005-503926 | | 2/2005 | |
| JP | 2005-052869 | | 3/2005 | |
| JP | 2005319470 A | * | 11/2005 | |
| JP | 2007-190603 | | 8/2007 | |
| JP | 2010-005692 | | 1/2010 | |
| JP | 2011-171080 | | 9/2011 | |
| WO | WO 03/026828 | | 4/2003 | |
| WO | WO 2011/027820 | | 3/2011 | |

OTHER PUBLICATIONS

Extended European search report, dated Dec. 23, 2015; Application No. 12861511.9.
China Office Action dated Aug. 28, 2015, with partial English Translation; Application No. 201280064851.1.
Taiwanese Office Action, dated Oct. 23, 2014, in corresponding Taiwanese Patent Application No. 101150095.

* cited by examiner

SN-CU-BASED LEAD-FREE SOLDER ALLOY

TECHNICAL FIELD

The present invention relates to a lead-free solder alloy and more specifically to an Sn—Cu based lead-free solder alloy.

BACKGROUND ART

Solder alloys are used, for example, to connect an electrode of an electronic device with another portion or to join an IC device to a shielding case and further a heat sink. Such solder alloys metallically join an electrode to a circuit board or an IC device to a shielding case or the like by making use of the wettability on metal constituting the electrode or the like.

Cu plating is often used on a surface of an electrode or the like to be joined by soldering. However, Ni plating is also often used. Therefore, cases where not only a Cu-plated surface but also an Ni-plated surface is soldered are often seen. Accordingly, solder alloys having excellent solderability on both Ni and Cu are required.

In general, soldering on an Ni-plated surface is difficult and hence a thin layer of Au or other metal has conventionally been formed by plating on the Ni-plated surface before soldering thereon.

As for the soldering on an Ni-plated surface, a Pb—Sn based solder alloy (Patent Literature 1: JP 60-166192 A), a Bi—Ag based solder alloy (Patent Literature 2: JP 2005-503926 A) and an Sn—Zn based solder alloy (Patent Literature 3: JP 2005-52869 A) have conventionally been proposed for use in die bonding.

CITATION LIST

Patent Literature

Patent Literature 1: JP 60-166192 A
Patent Literature 2: JP 2005-503926 A
Patent Literature 3: JP 2005-52869 A

SUMMARY OF INVENTION

Technical Problems

The prior art solder alloys as described above have some problems. Use of the Pb-containing solder alloy in Patent Literature 1 is limited from the viewpoint of environmental compatibility with consideration of effects on human health. The solder alloy in Patent Literature 2 which contains an Ag component as an expensive noble metal in a comparatively large amount leads to cost increases.

In addition, there is a tendency to avoid using the solder alloy containing a component such as Zn which is very unstable and is prone to oxidize (see Patent Literature 3) because corrosion and changes over time occur in the electrode.

Although a lead-free solder alloy containing no Ag or Zn, in other words, a solder alloy having a low impact on the environment, having excellent economic efficiency and exhibiting excellent solderability on both Cu and Ni is required as described above, the prior art solder alloys were not necessarily satisfactory materials.

An object of the present invention is to provide a novel solder alloy capable of overcoming the above-described problems.

Solution to Problems

The inventors of the present invention have found that an Sn—Cu—Al based solder alloy exhibits excellent wettability on an Ni-plated surface.

More specifically, it was found that addition of 0.01 to 0.1 wt % of Al to an Sn—Cu based solder alloy not only considerably improves the wettability on an Ni-plated surface but also contributes to good solderability on a Cu-plated surface and the present invention has been thus completed. It was also confirmed that such a solder alloy shows good wettability on Ni alloys such as nickel silver and cupronickel.

Further addition of 0.02 to 0.1 wt % of Ti and/or 0.01 to 0.05 wt % of Co to the foregoing Sn—Cu—Al solder alloy dramatically improved the wettability on an Ni surface. It was also found that the solderability on a Cu surface is also good.

As described above, soldering on an Ni metal member surface or an Ni-plated surface is generally difficult and hence the Ni-plated surface is subjected to Au plating (this plating is referred to as "Au flash plating") to ensure the wettability. In contrast, the solder of the present invention can be easily applied to soldering on an Ni-plated surface which is not plated with Au, and industrially inexpensive soldering is possible because it contains no noble metal. Of course, the solderability is further improved by performing Au flash plating on the Ni-plated surface.

The present invention provides a lead-free solder alloy having an alloy composition comprising: 0.6 to 0.9 wt % of Cu, 0.01 to 0.1 wt % of Al, 0.02 to 0.1 wt % of Ti, and a balance of Sn.

The total amount of Al and Ti may be in a range of 0.03 to 0.1 wt %.

The alloy composition may further comprise 0.01 to 0.05 wt % of Co.

Accordingly, the present invention provides the lead-free solder alloy having the alloy composition comprising: 0.6 to 0.9 wt % of Cu, 0.01 to 0.1 wt % of Al, 0.02 to 0.1 wt % of Ti, 0.01 to 0.05 wt % of Co serving as an optional component, and a balance of Sn.

These solder alloys are collectively called "solder alloys of the invention."

From another aspect, the present invention provides a lead-free solder alloy sheet with a thickness of up to 500 μm having the alloy composition according to any one of the foregoing.

The present invention provides an assembly of a shielding case and an IC device joined together by the solder alloy of the invention.

The present invention provides an assembly of a heat sink, a shielding case and an IC device, wherein the shielding case is further joined to the heat sink by the above-described solder alloy.

DESCRIPTION OF EMBODIMENTS

The present invention is further described below with reference to the drawings.

Figure 1:
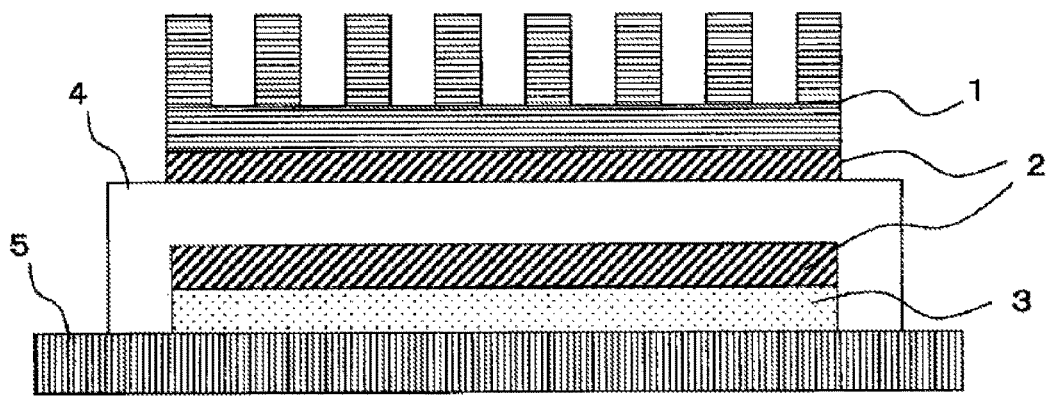
FIG. 1 is an illustration diagram schematically showing an embodiment using a solder alloy of the invention in soldering of an IC device.

FIG. 1 is an illustration diagram schematically showing how to join an IC device to heat dissipating members (a shielding case and a heat sink) by soldering using a solder alloy of the invention.

In the field of electrical and electronics industry, reduction in weight, thickness, length and size is in progress with daily technological innovation. Particularly in the semiconductor field, higher functionality and higher density are pursued. With the trend toward higher functionality, a large current needs to be applied to a semiconductor device and the amount of heat generated in a semiconductor portion tends to increase. The heat dissipation performance for releasing the generated heat outside is a very important factor directly linked to higher semiconductor performance and its reliability.

A heat sink as shown in FIG. 1 is commonly used as a semiconductor heat dissipating member. Metallic materials having high thermal conductivity such as Cu metal, Ni-plated Cu metal and Al metal are used in the heat sink and the shielding case serving as heat dissipating members.

In the illustrated example, the IC device 3 such as BGA or Si provided on a substrate 5 is connected to the heat sink 1 via the shielding case 4 and a solder alloy 2 of the invention is used to connect the IC device 3 to the shielding case 4 and also to connect the shielding case 4 to the heat sink 1. The sheet-like solder alloy according to the invention is interposed between the IC device 3 and the shielding case 4 and between the shielding case 4 and the heat sink 1 to form an assembly, which is then heated in a reflow oven or the like and soldered.

Figure 2:
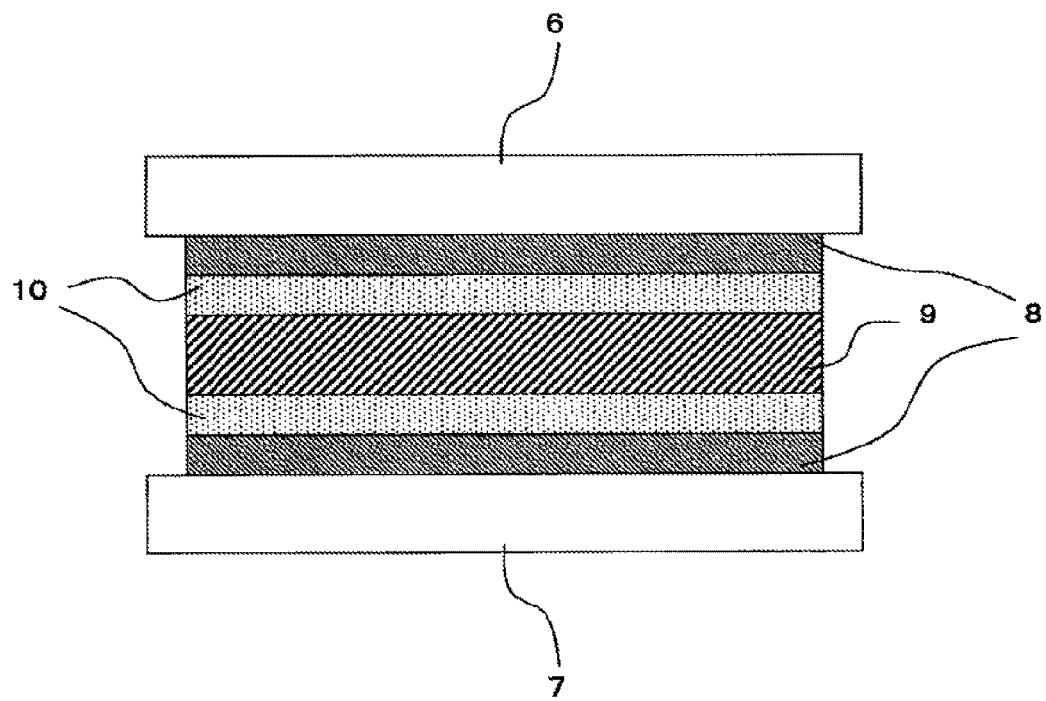
FIG. 2 is an illustration diagram schematically showing the state before heating when an assembly of an IC device and a shielding case is soldered with the use of the solder alloy of the invention on an Ni-plated surface coated by Au flash plating.
Figure 3:
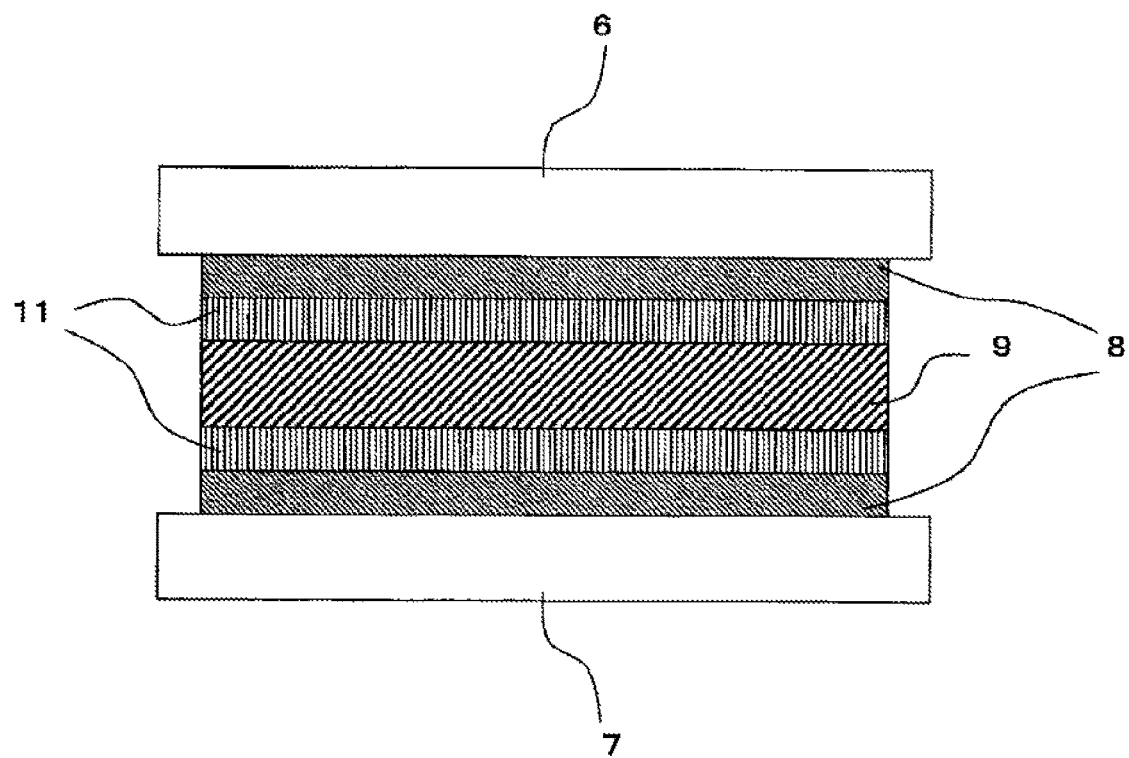
FIG. 3 is a schematic illustration diagram of the structure of a solder joint when the assembly shown in FIG. 2 is heated and joined.

FIGS. 2 and 3 are illustration diagrams schematically showing joint portions before and after heating to a soldering temperature, respectively, and show a case where Ni-plated surfaces are subjected to Au flash plating to prevent oxidation while enhancing the solderability and the thus obtained joint surfaces are joined together by soldering using the solder alloy of the invention. Like members are identified by the same numerals. It is of course possible to perform effective soldering on the Ni-plated surfaces without performing expensive Au plating by using the solder alloy according to the invention.

FIG. 2 shows an assembly before soldering and FIG. 3 shows the assembly after soldering. The shielding case is further joined to the heat sink by soldering and also in this case soldering is preferably performed using the solder of the invention.

In the illustrated example, an Ni-plated layer 8 is formed on each of an IC device 7 and a shielding case 6 and is then coated with an Au-plated layer 10 by Au flash plating to form the joint surfaces. These joint surfaces are heated and joined together through a solder 9 of the invention. When heated, the Au-plated layer 10 shown in FIG. 2 disappears through diffusion into the solder to form an Sn—Cu—Ni based intermetallic compound layer 11 as shown in FIG. 3.

Indium(In), a resin material containing Indium, grease and a conductive tape have conventionally been used in this connection. However, Indium is a noble metal and is expensive as a junction material, and hence has difficulty with economic efficiency like an Ag-containing material. Grease and a conductive tape have problems with heat resistance and adhesion to a semiconductor device or member.

According to the invention, as shown in FIG. 1, metallic junction is made possible by using the solder alloy of the invention to join the Ni-plated IC device (semiconductor device) to the shielding case or to join the shielding case to the heat sink. Surfaces of the shielding case and the heat sink may also be subjected to Ni plating or Ni/Au flash plating.

This enables design for heat dissipation having high thermal conductivity, high heat resistance and high adhesion which have heretofore been difficult to achieve in a conventional junction system.

According to the invention, the solder alloy components are defined for the following reasons:

According to the invention, Cu is blended to improve the strength of the solder alloy while adjusting the melting point.

In general, the solder used in a semiconductor mounting portion is an SnAgCu based alloy mainly typified by an Sn-3 wt % Ag-0.5 wt % Cu solder along with the recent trend toward lead-free production.

The solder alloy according to the invention has a melting point of around 227 to 230° C. which is a melting point close to that of an Sn—Cu alloy having a eutectic composition, and Cu is added in an amount of 0.6 to 0.9 wt % in order to adjust the melting point.

A Cu content of less than 0.6 wt % is not sufficient to improve the strength, whereas a Cu content in excess of 0.9 wt % is not appropriate because of a high melting point and poor mechanical ductility. The Cu content is preferably from 0.7 to 0.9 wt %.

One of the characteristic features of the invention is to blend Al but an Al content of less than 0.01 wt % is not sufficient to show the effect of improving the wettability. On the other hand, at an Al content in excess of 0.1 wt %, Al which is prone to oxidize during melting is more likely to concentrate on the solder surface and the object of the invention cannot be achieved with regard to the wettability. The Al content is preferably from 0.02 to 0.07 wt %.

In particular, the wettability on Ni is significantly improved by further adding 0.02 to 0.1 wt % of Ti to the solder alloy of the invention. Particularly when the total amount of Al and Ti is in a range of 0.03 to 0.1 wt %, the effect of improving the wettability is significant.

Co may be further optionally added to the Sn—Cu—Al solder alloy of the invention in an amount of 0.01 to 0.05 wt %. The addition of Co makes it possible not only to further improve the wettability of the solder alloy of the invention on the Ni surface but also to increase the strength and hardness as the junction material.

In the meanwhile, the semiconductor device used is often primarily composed of silicon having a low coefficient of thermal expansion and a heat sink and a shielding case to be joined thereto are metallic materials. Thermal strain or thermal stress due to a difference in coefficient of thermal expansion between the components resulting from application of current is applied to the joint portion between a semiconductor and a heat dissipating member (a heat sink or a shielding case), which may cause cracking or peeling of the joint.

It is believed that the solder alloy according to the invention can follow any deformation caused by thermal stress because the mechanical ductility can be improved in addition to the above-described operational advantage by adding a small amount of Al to the Sn—Cu solder. In addition to this, it is believed that, by adding Al and further optionally Ti in an amount as small as 0.02 to 0.1 wt % to the Sn—Cu alloy, a structure primarily composed of Sn can be made finer to enable the effect of suppressing progress of cracking due to internal stress and longer life of the solder alloy owing to stress relaxing properties.

The solder alloy of the invention is not particularly limited in its form and may be used in appropriate forms such as solder bar, solder powder, solder ball and solder sheet.

Particularly in view of the excellent solderability on an Ni surface, it turns out that the solder alloy of the invention can be advantageously used in the form of a solder alloy sheet in soldering an IC device or the like to heat dissipating members (a shielding case and a heat sink) for use in heat dissipation from the IC device.

Since the solder of the invention has particularly excellent solderability on an Ni surface, a shielding case and an IC device can be easily joined together by forming the solder into a sheet and heating it in a conveyor-type reflow oven or an oven furnace for solder joint as it is held from the shielding case and the bottom surface of the IC device. The solder sheet in this process has a thickness of 500 μm or less. The lower limit is not specifically defined and is usually at least 200 μm because of manufacturing limitations. The solder sheet according to the invention is cut into appropriate width and length according to the surfaces to be joined together by soldering and is used for the above-described soldering.

The present invention has been described on the solder alloy used to join an IC device to a shielding case or a heat sink but the solder alloy according to the invention is also applied in the same manner to soldering of an electrode in a circuit board as is already understood by a person skilled in the art. In this case, the solder alloy can be used as a pellet- or disk-shaped solder preform.

EXAMPLES

Solders each having an alloy composition as shown in Table 1 were prepared and subjected to a wettability test according to the procedure described below, and the wettability and the tensile strength of each of the solders were measured.

Wettability Test

The wettability of the solder alloys was examined by a wetting balance method.

Ni sheets and Cu sheets (thickness: 0.3 mm; width: 10 mm; length: 30 mm) were used as specimens.

A thin layer of resin flux for soldering was applied to a surface of each specimen and the specimen was immersed in molten solder heated and held at 260° C. to obtain a curve of wettability against time axis. The zero cross time was determined from the wettability curve to evaluate the wettability.

Test results are shown in Table 1. As for the wettability on the Ni sheets, a specimen having a zero cross time shorter by about 1 second or more than that of an Sn-0.7 wt % Cu alloy solder having a basic composition was rated "good." Since the basic composition showed a zero cross time of 5.4 seconds, a specimen having a zero cross time of 2 seconds or more but less than 4 seconds was deemed to have improved wettability and rated "good." A specimen having a zero cross time of less than 2 seconds was rated "excellent" and a specimen having a zero cross time of 4 seconds or more was rated "poor."

The wettability on the Cu sheets was evaluated in the same manner and all the results are shown in Table 1. Criteria for judging the wettability were defined in the same manner as in the Ni sheets: A specimen having a zero cross time of less than 1.1 seconds which indicates that the specimen is more wettable than the Sn-0.7Cu solder having the basic composition was rated "excellent," a specimen having a zero cross time of 1.1 seconds or more but less than 1.6 seconds was rated "good" and a specimen having a zero cross time of 1.6 seconds or more was rated "poor"

TABLE 1

|  | Alloy composition [wt %] | | | | Zero cross time [sec] | | | |
| --- | --- | --- | --- | --- | --- | --- | --- | --- |
|  | Cu | Al | Ti | Co | Ni sheet | | Cu sheet | |
| Reference Example 1 | 0.6 | 0.05 |  |  | 2.9 | Good | 1.4 | Good |
| Reference Example 2 | 0.6 | 0.1 |  |  | 1.8 | Excellent | 1.3 | Good |
| Reference Example 3 | 0.7 | 0.03 |  |  | 3.5 | Good | 1.3 | Good |
| Reference Example 4 | 0.7 | 0.01 |  |  | 2.6 | Good | 1.3 | Good |
| Reference Example 5 | 0.7 | 0.1 |  |  | 3.1 | Good | 1.5 | Good |
| Reference Example 6 | 0.9 | 0.09 |  |  | 2.4 | Good | 1.3 | Good |
| Example 1 | 0.7 | 0.03 | 0.03 |  | 1.7 | Excellent | 1.2 | Good |
| Reference Example 7 | 0.7 | 0.03 |  | 0.03 | 2.5 | Good | 1.5 | Good |
| Example 2 | 0.7 | 0.03 | 0.05 |  | 1.6 | Excellent | 1.3 | Good |
| Example 3 | 0.7 | 0.04 | 0.05 |  | 2.1 | Good | 1.4 | Good |
| Example 4 | 0.7 | 0.05 | 0.02 |  | 2.5 | Good | 1.4 | Good |
| Example 5 | 0.7 | 0.06 | 0.03 |  | 1.9 | Excellent | 1.4 | Good |
| Example 6 | 0.7 | 0.01 | 0.02 | 0.01 | 3.2 | Good | 1.2 | Good |
| Example 7 | 0.9 | 0.01 | 0.02 | 0.02 | 3.2 | Good | 1.1 | Good |
| Comparative Example 1 | 0.6 |  |  |  | 7.0 | Poor | 1.3 | Good |
| Comparative Example 2 | 0.7 |  |  |  | 5.4 | Poor | 1.1 | Good |
| Comparative Example 3 | 0.9 |  |  |  | 4.8 | Poor | 1.2 | Good |
| Comparative Example 4 | 0.4 | 0.003 |  |  | 8.4 | Poor | 1.8 | Poor |
| Comparative Example 5 | 0.4 | 0.15 |  |  | 7.5 | Poor | 1.8 | Poor |
| Comparative Example 6 | 0.6 | 0.004 |  |  | 4.0 | Poor | 1.3 | Good |
| Comparative Example 7 | 0.7 | 0.003 |  |  | 8.2 | Poor | 1.1 | Good |
| Comparative Example 8 | 0.7 | 0.15 |  |  | 6.2 | Poor | 1.9 | Poor |
| Comparative Example 9 | 0.8 | 0.12 |  |  | 5.9 | Poor | 1.5 | Good |
| Comparative Example 10 | 1 | 0.004 |  |  | 6.8 | Poor | 1.3 | Good |
| Comparative Example 11 | 1 | 0.2 |  |  | 4.1 | Poor | 1.5 | Good |

(Evaluation of Wettability on Ni and Cu)

As is seen from the results shown in Table 1, the Sn-0.6 to 0.9 wt % Cu alloys show poor wettability on Ni but the wettability on Ni is improved by adding 0.01 to 0.1 wt % of Al thereto.

Likewise, good wettability is also exhibited on Cu by adding 0.01 to 0.1 wt % of Al to the Sn—Cu solder alloy.

The wettability on Ni is dramatically improved by adding 0.02 to 0.1 wt % of Ti to the Sn—Cu solder alloy in addition to Al. The wettability on Ni is considerably improved particularly when the total amount of Al and Ti added is in a range of about 0.03 to about 0.1 wt %.

Figure 4:
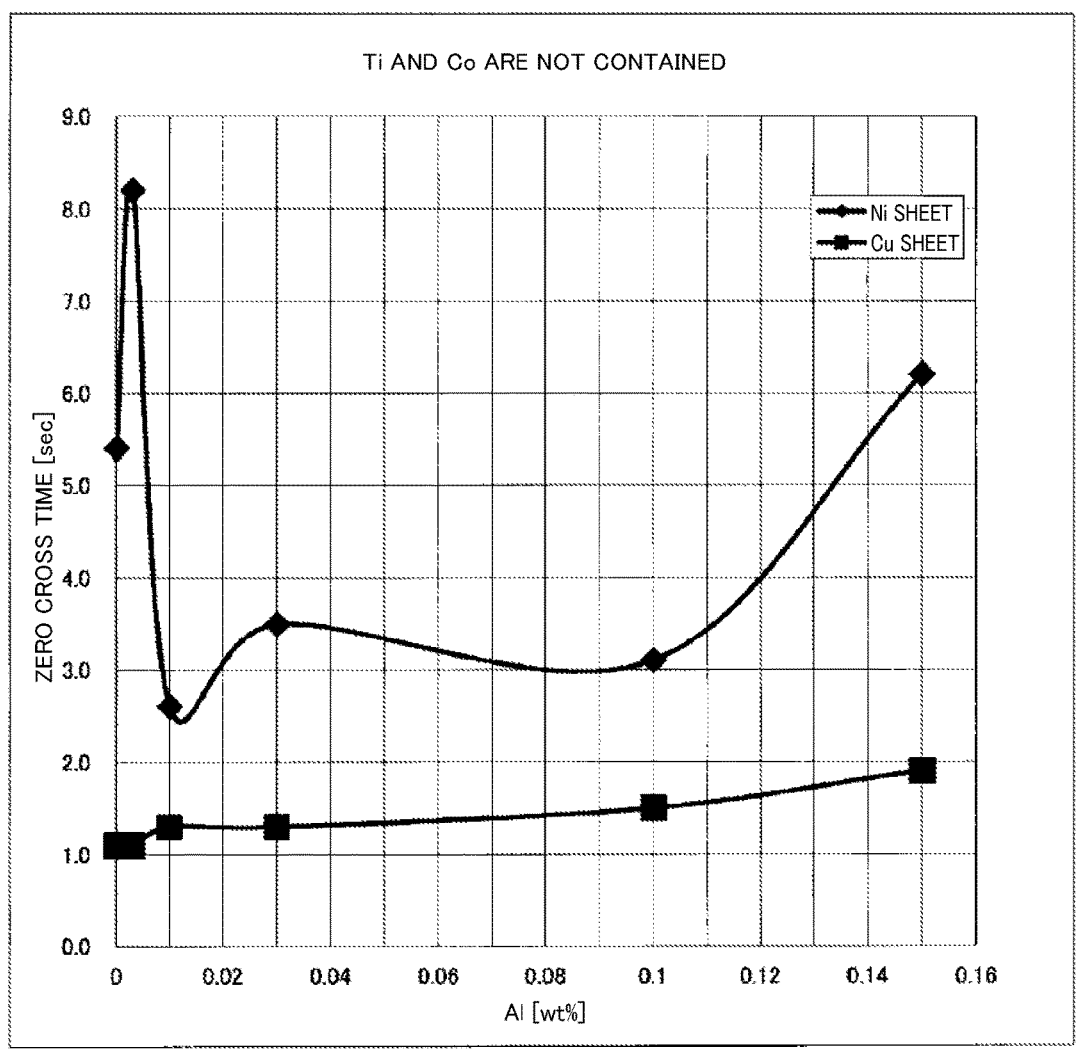
FIG. 4 is a graph showing a relationship between the Al content and the solderability in an Sn—Cu solder alloy based on data in Table 1.

FIG. 4 is a graph prepared based on data in Table 1 and shows how the solderability of the Sn-0.7Cu solder alloy containing varying amounts of Al on Ni surfaces and Cu surfaces changes. It is revealed that, although the solderability on the Cu surfaces is not particularly influenced by the Al content, particularly excellent solderability is exhibited on the Ni surfaces at an Al content of 0.01 to 0.1%.

The invention claimed is:

1. A lead-free solder alloy composition consisting of: 0.6 to 0.9 wt % of Cu, 0.01 to 0.1 wt % of Al, 0.02 to 0.1 wt % of Ti, optionally 0.01 to 0.05 wt % of Co, and a balance of Sn.

2. The lead-free solder alloy according to claim 1, wherein the 0.01 to 0.05 wt % of Co is included in the alloy composition.

3. The lead-free solder alloy according to claim 1, wherein the total amount of Al and Ti is in a range of 0.03 to 0.1 wt %.

4. The lead-free solder alloy according to claim 3, wherein the 0.01 to 0.05 wt % of Co is included in the alloy composition.

5. A lead-free solder alloy sheet with a thickness of up to 500 um having the alloy composition according to claim 1.

6. An assembly comprising a shielding case and an IC device joined together by the lead-free solder alloy according to claim 1.

7. The assembly according to claim 6 further comprising a heat sink, wherein the heat sink and the shielding case are joined together by the lead-free solder alloy.

* * * * *